(12) United States Patent
Cohen et al.

(10) Patent No.: US 9,406,530 B2
(45) Date of Patent: Aug. 2, 2016

(54) TECHNIQUES FOR FABRICATING REDUCED-LINE-EDGE-ROUGHNESS TRENCHES FOR ASPECT RATIO TRAPPING

(71) Applicant: International Business Machines Corporation, Armonk, NY (US)

(72) Inventors: Guy Cohen, Mohegan Lake, NY (US); Katherine L. Saenger, Ossining, NY (US); Kuen-Ting Shiu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 14/227,250

(22) Filed: Mar. 27, 2014

(65) Prior Publication Data

US 2015/0279696 A1 Oct. 1, 2015

(51) Int. Cl.
| | | |
|---|---|---|
| H01L 21/4763 | (2006.01) | |
| H01L 21/324 | (2006.01) | |
| H01L 29/20 | (2006.01) | |
| H01L 29/06 | (2006.01) | |
| H01L 21/311 | (2006.01) | |
| H01L 21/02 | (2006.01) | |

(52) U.S. Cl.
CPC ...... *H01L 21/3247* (2013.01); *H01L 21/02532* (2013.01); *H01L 21/02538* (2013.01); *H01L 21/02639* (2013.01); *H01L 21/31116* (2013.01); *H01L 29/0649* (2013.01); *H01L 29/0692* (2013.01); *H01L 29/20* (2013.01); *H01L 29/2003* (2013.01)

(58) Field of Classification Search
USPC .......... 438/624, 479, 481, 674, 675
See application file for complete search history.

(56) References Cited

U.S. PATENT DOCUMENTS

| | | |
|---|---|---|
| 6,811,956 B1 | 11/2004 | Gabriel |
| 7,229,929 B2 | 6/2007 | Chowdhury |
| 7,368,363 B2 | 5/2008 | Hiruta et al. |
| 7,449,414 B2 | 11/2008 | Ventzek et al. |
| 7,642,193 B2 | 1/2010 | Ventzek et al. |
| 7,670,760 B2 | 3/2010 | Shen et al. |
| 8,389,347 B2 | 3/2013 | Tezuka et al. |

(Continued)

FOREIGN PATENT DOCUMENTS

JP 2005150398 A 6/2005

OTHER PUBLICATIONS

Tutor62 "Measuring Line Edge Roughness: Fluctuations in Uncertainty," The Lithography Expert (version May 26, 2008).

(Continued)

*Primary Examiner* — Kevin M Picardat
(74) *Attorney, Agent, or Firm* — Louis J. Percello; Michael J. Chang, LLC

(57) ABSTRACT

The present invention provides ART techniques with reduced LER. In one aspect, a method of ART with reduced LER is provided which includes the steps of: providing a silicon layer separated from a substrate by a dielectric layer; patterning one or more ART lines in the silicon layer selective to the dielectric layer; contacting the silicon layer with an inert gas at a temperature, pressure and for a duration sufficient to cause re-distribution of silicon along sidewalls of the ART lines patterned in the silicon layer; using the resulting smoothened, patterned silicon layer to pattern ART trenches in the dielectric layer; and epitaxially growing a semiconductor material up from the substrate at the bottom of each of the ART trenches, to form fins in the ART trenches.

23 Claims, 8 Drawing Sheets

(56) References Cited

U.S. PATENT DOCUMENTS

| | | | |
|---|---|---|---|
| 8,481,341 B2 | 7/2013 | Clark | |
| 8,609,517 B2 * | 12/2013 | Wann | C30B 25/186 257/189 |
| 8,629,446 B2 * | 1/2014 | Lochtefeld | H01L 21/0243 257/65 |
| 2009/0085169 A1 | 4/2009 | Rachmady et al. | |
| 2013/0115721 A1 * | 5/2013 | Clark | H01L 21/02532 438/12 |
| 2014/0099774 A1 * | 4/2014 | Vincent | H01L 29/161 438/431 |

OTHER PUBLICATIONS

J.Z. Li, et al., "Defect reduction of GaAs epitaxy on Si (001) using selective aspect ratio trapping," Appl. Phys. Lett., vol. 91, Issue 2, 021114 (Jul. 2007).

Choi et al. "FinFET Process Refinements for Improved Mobility and Gate Work Function Engineering," IEEE-IEDM 2002, paper 10.4.1, p. 259-262 (Dec. 2002).

Mizushima et al., "Empty-space-in-silicon technique for fabricating a silicon-on-nothing structure," Appl. Phys. Lett. 77, 3290 (Nov. 2000).

* cited by examiner

TECHNIQUES FOR FABRICATING REDUCED-LINE-EDGE-ROUGHNESS TRENCHES FOR ASPECT RATIO TRAPPING

FIELD OF THE INVENTION

The present invention relates to aspect ratio trapping (or ART), and more particularly, to ART techniques with reduced line-edge-roughness (LER).

BACKGROUND OF THE INVENTION

The performance advantages of III-V materials for many device applications have led to substantial interest in integrating these materials (and/or germanium (Ge)) with silicon (Si) technology. However, lattice mismatch issues can make it difficult to grow high quality, low defect III-V and Ge materials on Si substrates. A new approach, known as "aspect ratio trapping" (or ART) has been devised to overcome this problem. See, for example, J. Z. Li, et al., "Defect reduction of GaAs epitaxy on Si (001) using selective aspect ratio trapping," Appl. Phys. Lett., vol. 91, Issue 2, 021114 (July 2007) (hereinafter "Li"). According to the process in Li, trenches are patterned (e.g., using reactive ion etching (RIE) through a patterned photoresist) in a layer over a crystalline substrate, and a III-V (or Ge) material is then selectively and epitaxially grown up from the trench bottoms to form fin shapes. The goal is that defects will get trapped by the trench sidewalls, and that the material in the upper portion of the fins will be defect free.

A concern with this approach, however, is that line-edge-roughness (LER) on the trench sidewalls (i.e., introduced by the lithographic patterning of the trenches—as a result of the photoresist roughness and/or the RIE process (RIE is a stochastic process that can induce sidewall roughness even if the photoresist had no LER)) will be exactly replicated in the III-V fins. LER on the sidewalls of fins used for FET devices is expected to reduce mobility (due to carrier scattering from the fin surfaces) and degrade threshold voltage control (due to variations in the fin width). In addition, LER on fins whose sidewalls are used as templates for subsequent epitaxial growth can introduce a distribution of exposed surface plane orientations which can lead to defective growth (since growth rate can depend on crystal orientation, leading to non-uniform and sometimes intersecting growth fronts). And finally, LER on the trench edges can potentially degrade the crystal quality of the grown fins if, for example, filling in the LER requires growth on non-favored crystal planes or if trench-edge asperities induce undesired spontaneous nucleation of III-V material that is supposed to grow epitaxially. An ART process can also be used with wider "fins" where the FET is made over the top surface of the wide "fin" as a planar device.

LER typically becomes more problematical as feature dimensions decrease. LER in an etched feature comes primarily from the LER replicated from the initial mask pattern, though additional random LER (unrelated to LER in the mask) can be introduced by the etching process used to transfer the pattern.

Given the ubiquity of LER and its potentially deleterious effects, it would be desirable to have techniques for making ART trenches and III-V fin structures with reduced LER. In particular, it would be desirable to have methods for making ART trenches and III-V fin structures with LER less than the LER introduced by the lithographic patterning.

SUMMARY OF THE INVENTION

The present invention provides aspect ratio trapping (ART) techniques with reduced line-edge-roughness (LER). In one aspect of the invention, a method of ART with reduced LER is provided. The method includes the steps of: providing a silicon layer separated from a substrate by a dielectric layer; patterning one or more ART lines in the silicon layer selective to the dielectric layer; contacting the silicon layer with an inert gas at a temperature, pressure and for a duration sufficient to cause re-distribution of silicon along sidewalls of the ART lines patterned in the silicon layer, thereby reducing an LER of the ART lines in the silicon layer as compared to a LER of the ART lines as patterned in the silicon layer, resulting in formation of a smoothened, patterned silicon layer; using the smoothened, patterned silicon layer to pattern one or more ART trenches in the dielectric layer, wherein the substrate is exposed at a bottom of each of the trenches; and epitaxially growing a semiconductor material in the trenches, up from the substrate at the bottom of each of the ART trenches, to form fins in the ART trenches.

In another aspect of the invention, another method of ART with reduced LER is provided. The method includes the steps of: patterning one or more ART trenches in a silicon substrate using a patterned hardmask; contacting the substrate with an inert gas at a temperature, pressure and for a duration sufficient to cause re-distribution of silicon along sidewalls of the ART trenches patterned in the substrate, thereby reducing an LER of the ART trenches as compared to a LER of the ART trenches as patterned in the substrate; forming spacers along the sidewalls of each of the ART trenches; and epitaxially growing a semiconductor material in the ART trenches, up from the substrate at the bottom of each of the ART trenches, to form fins in the ART trenches.

In yet another aspect of the invention, a silicon substrate is provided that includes one or more silicon fins separated from one or more epitaxial III-V semiconductor material fins by an oxide, wherein the epitaxial III-V semiconductor material is selected from the group consisting of: aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium nitride, indium nitride, indium phosphide and combinations comprising at least one of the foregoing materials.

A more complete understanding of the present invention, as well as further features and advantages of the present invention, will be obtained by reference to the following detailed description and drawings.

DETAILED DESCRIPTION OF PREFERRED EMBODIMENTS

As provided above, with conventional aspect ratio trapping (or ART) techniques where, for instance, III-V or germanium (Ge)-containing materials are epitaxially grown in patterned trenches, line-edge-roughness (LER) poses a problem. Namely, the LER introduced by the lithographic patterning invariably gets replicated in the epitaxially grown material. This is undesirable.

Advantageously, provided herein are techniques for reducing the lithography-introduced LER prior to epitaxy. The result is ART trenches and III-V fin structures with LER that is less than the LER introduced by the lithographic patterning. The present techniques generally involve using an annealing process in an inert gas, such as hydrogen gas, to smoothen either the silicon mask used to pattern trenches (in which the epitaxial material is grown) or the trenches themselves (when the trenches are patterned in a silicon substrate) with the overall goal being to reduce the LER of the trenches. As a result, the fins epitaxially grown in the fins will have the same reduced LER. The first exemplary scenario generally involves using an anneal smoothened silicon mask to pattern trenches in a dielectric, and then epitaxially growing fins in the trenches up from an underlying substrate. One advantage to this first scenario is that an array of different substrates may be employed irrespective of the annealing process since it is the silicon mask that is the target of the smoothening anneal (not the substrate). Several exemplary embodiments of the first (anneal-smoothened silicon mask) scenario are described below in conjunction with the description of FIGS. 1-13, below.

A second exemplary scenario provided herein involves use of a silicon substrate in which the trenches are patterned. Since a silicon substrate can benefit from a smoothening anneal, the present anneal in an inert gas is performed directly on the already-patterned trenches to reduce sidewall LER. Fins can then be epitaxially grown (e.g., from a different material such as a III-V semiconductor) in the trenches. An advantage to this second (anneal-smoothened trenches) is that a plurality of silicon and (e.g., III-V) fins can be produced that are planar or substantially planar across the surface of a wafer, thus enabling different device configurations to be built using each of these fin materials. Several exemplary embodiments of the second (anneal-smoothened trenches) scenario are described below in conjunction with the description of FIGS. 14-21, below.

Figure 1:
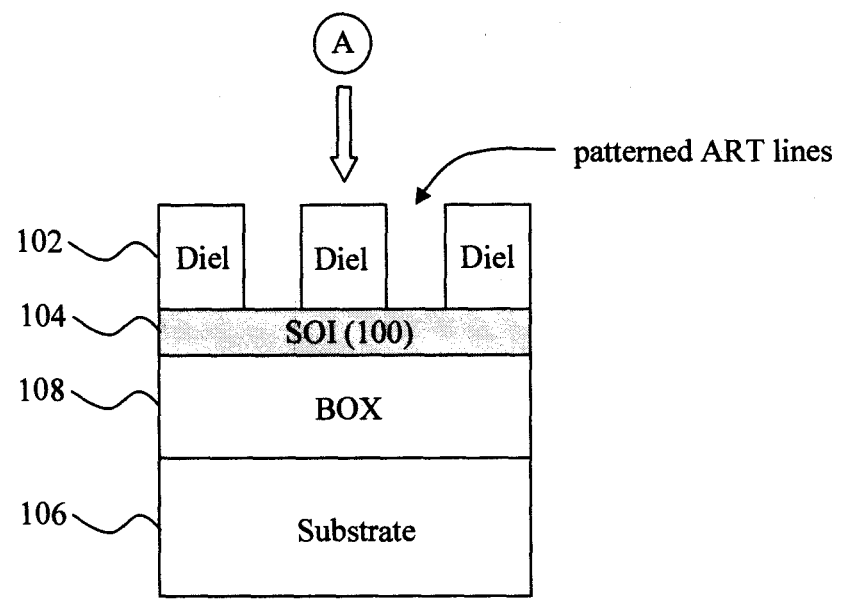
FIG. 1 is a cross-sectional diagram illustrating a starting structure for a process for making aspect ratio trapping (or ART) trenches and (e.g., fin) structures within the trenches having line-edge-roughness (LER) having a patterned dielectric mask over a semiconductor-on-insulator (SOI) layer of an SOI wafer according to an embodiment of the present invention.

The first scenario is now described. Referring to FIG. 1, the process generally involves first using a hardmask or resist, such as patterned dielectric (diel) 102, to pattern a silicon-on-insulator (SOI) layer of an SOI wafer. Once patterned, the sidewalls of the SOI layer are smoothed using an anneal such that when the SOI layer is used to pattern trenches in the wafer the SOI layer will serve as a near-perfect, defect free mask. While patterned dielectric 102 is being used in the instant description and figures as an exemplary mask to pattern the SOI layer, any other suitable hardmask or resist material(s) known in the art may be used in the same manner described. A SOI wafer commonly includes a SOI layer 104 separated from a substrate 106 by a buried oxide (or BOX) 108. See FIG. 1. The substrate can be any suitable semiconductor material which, present at the bottom of the trenches (see below), can serve as the basis for epitaxial growth of fins in the trenches. By way of example only, the substrate is a Si, Ge, or SiGe substrate.

Figure 2:
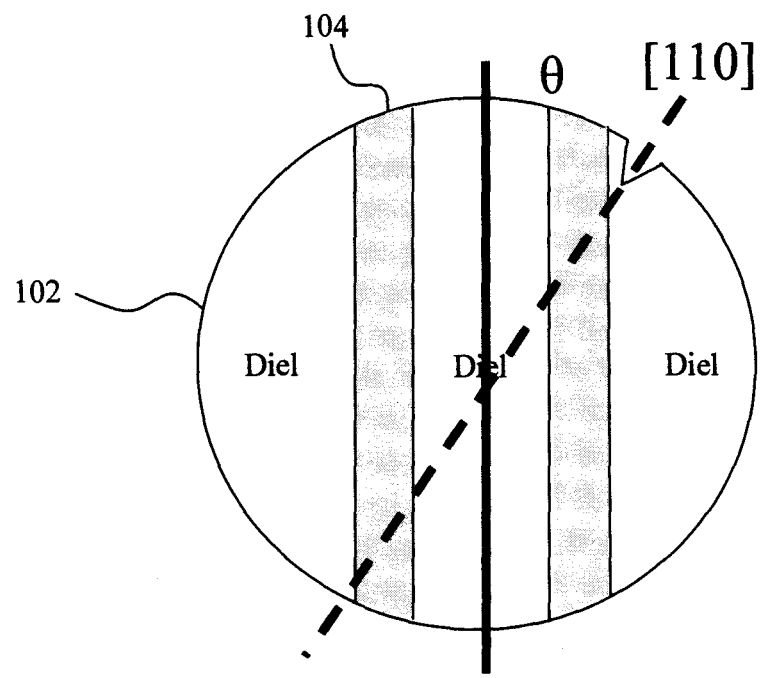
FIG. 2 is a top-down diagram of the structure of FIG. 1 illustrating an optional step to reduce LER by aligning the direction of the patterned dielectric mask with the surface orientation of the underlying SOI layer according to an embodiment of the present invention.
Figure 3:
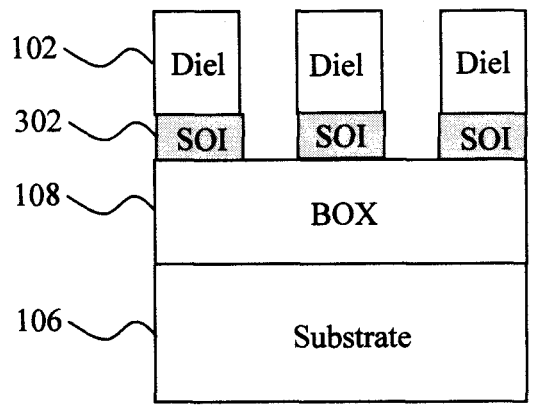
FIG. 3 is a cross-sectional diagram illustrating the dielectric having been used as a mask to pattern lines in the SOI layer according to an embodiment of the present invention.
Figure 4:
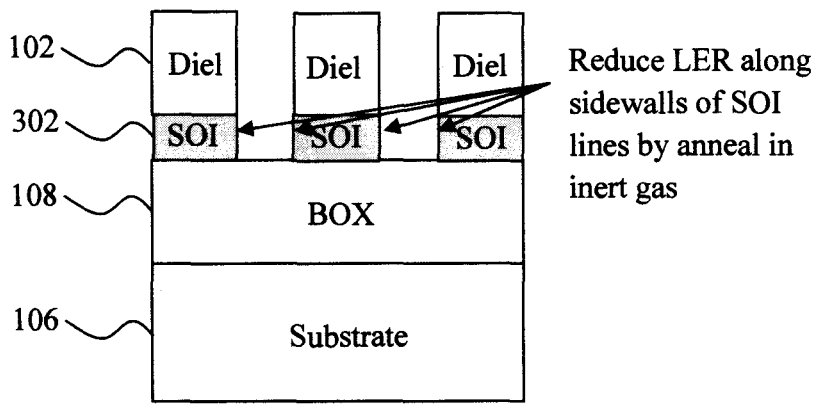
FIG. 4 is a cross-sectional diagram illustrating an anneal begin performed to reduce LER of the lines patterned in the SOI according to an embodiment of the present invention.

Steps may however be taken prior to patterning (and annealing) the SOI layer to further reduce LER. One step that may be taken is to insure proper crystallographic alignment of the materials in the starting wafer with respect to the orientation of the trench sidewalls. For instance, patterning trenches (using for example reactive ion etching (RIE)) with (110) oriented sidewalls along the (110) crystallographic plane of the SOI layer (the SOI layer having a surface orientation (100)) will result in a reduced LER as compared to the case where the trenches are patterned at an arbitrary orientation with respect to the SOI layer. The SOI layer 104 and the substrate 106 do not need to be of the same material or the same orientation. That enables the fabrication of fins with sidewall orientation different than that of the ART trench. For example, to make fins with (100) oriented sidewalls, a (100) surface oriented SOI layer is preferably bonded with a 45 degree ($\theta$) rotation of the SOI notch with respect to substrate notch. See FIG. 2. FIG. 2 is a top-down view (for example from vantage point A) of the structure of FIG. 1. In FIG. 2, the solid line represents the substrate notch and the dotted line represents the notch in the SOI layer. Due to the 45 degree rotation the (110) sidewalls in the SOI layer 104 will be aligned to the (100) sidewalls of the fins made by the ART process. As highlighted above, the dielectric hardmask may be patterned using conventional lithography and etching techniques. A suitable etching process for the dielectric is RIE.

The next step in the process is to use the patterned dielectric 102 as a mask to pattern lines in the SOI layer 104. See FIG. 3. According to an exemplary embodiment, the SOI layer 104 is patterned using a RIE process. Basically, in this step RIE is used to transfer the pattern (i.e., the footprint and location of the trenches) to the SOI layer 104. It is preferable to use an etch chemistry selective for the SOI layer with the BOX 108 serving as an etch stop since the purpose of patterning the SOI layer is 104 is to create a mask to be used later in the process to pattern the underlying BOX 108. The SOI layer post-patterning is given the reference numeral 302.

Following patterning of the SOI layer, the patterned dielectric 102 can be removed if so desired. However, as will next be described, an anneal is used to smoothen the side walls of the patterned SOI layer 302. Thus, as shown in the figures, the patterned dielectric 102 is preferably left in place during the smoothening anneal in order to protect the top surface of the SOI layer 302. See FIG. 4.

According to an exemplary embodiment, during the smoothening annealing process, the wafer (preferably with the patterned dielectric 102 in place over, and protecting the top surfaces of, the patterned SOI layer 302) is contacted with an inert gas at a temperature, pressure and for a duration sufficient to cause migration and re-distribution of the SOI layer along the sidewalls of the lines. The term "inert gas" refers to a gas that does not react with the SOI layer. Exemplary inert gases include, but are not limited to, hydrogen ($H_2$), xenon (Xe), helium (He) and potentially others. A content of oxygen ($O_2$) or water ($H_2O$) in the inert gas is typically very small and can be further reduced (to part per billion levels) by the use of gas purifiers. While the presence of $O_2$ or $H_2O$ is typically viewed as undesirable, it actually provides a way for controlling the rate of the SOI re-distribution. The rate is controlled by a total pressure of the inert gas in contact with the wafer. Immediately prior to the smoothening anneal, it is desirable to remove any native oxide present on the SOI sidewalls for example by a wet etch using diluted hydrofluoric acid (HF).

Figure 25A:
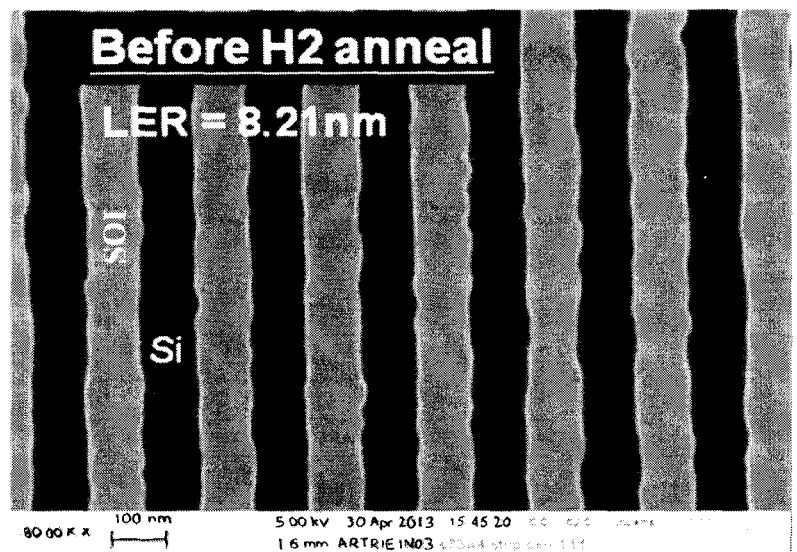
FIG. 25A is a top-down image of an as-patterned SOI layer (prior to smoothening anneal) having line edge roughness (LER) according to an embodiment of the present invention.
Figure 25B:
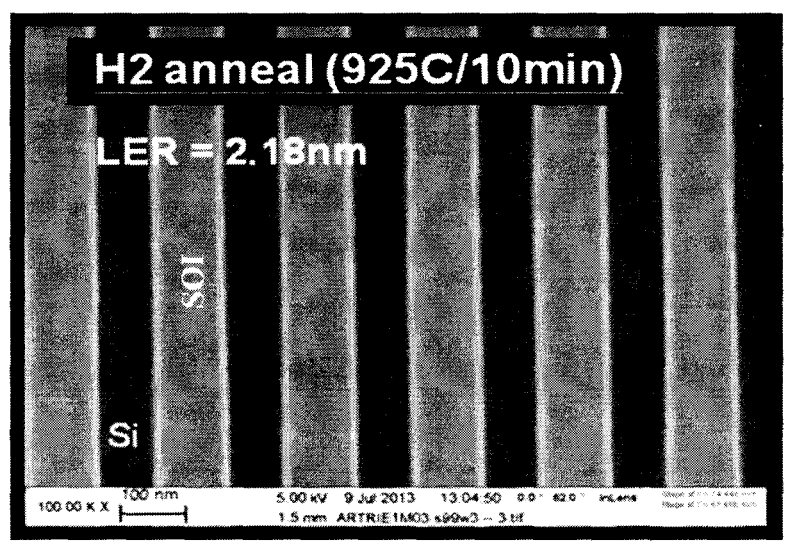
FIG. 25B is a top-down image of the patterned SOI layer following a smoothening anneal according to the present techniques according to an embodiment of the present invention.

During the smoothening anneal silicon diffuses on the surface of the sidewalls. The diffusion rate of the surface silicon atoms is proportional to the curvature of the surface. As a result, the net silicon diffusion in rough regions, which are characterized as having high curvature, is larger than that of smooth regions which are flat (no curvature). Rough regions are therefore smoothened out as the surface with large curvature is flattened by redistribution of silicon. According to an exemplary embodiment, the smoothening anneal is performed with a gas pressure of the inert gas of from about 30 torr to about 1000 torr, at a temperature of from about 600 degrees Celsius (° C.) to about 1100° C. and for a duration of from about one minute to about 120 minutes. In general, the rate of Si re-distribution increases with temperature and decreases with an increase in pressure. For a general discussion of semiconductor reshaping using $H_2$ annealing see, for example, U.S. Pat. No. 8,441,043 issued to Bangsaruntip et al., entitled "Maskless Process for Suspending and Thinning Nanowires," the entire contents of which are incorporated by reference herein. Images of samples before and after the present smoothening anneal are shown in FIGS. 25A and 25B, described below.

If present, the patterned dielectric may be removed following the smoothening anneal, using for example a selective wet etching process. What remains is a near-perfect patterned SOI layer 302 mask, meaning that the patterned SOI layer 302 has minimal LER due to the smoothening anneal. Subsequent use of the patterned SOI layer 302 as a mask to pattern the BOX 108 (see below) will in turn result in reduced LER in the patterned BOX. See FIG. 5.

Figure 5:
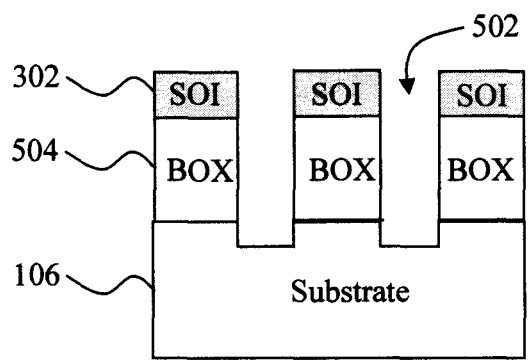
FIG. 5 is a cross-sectional diagram illustrating the patterned (and smoothed) SOI layer having been used to pattern trenches in the BOX according to an embodiment of the present invention.
Figure 6:
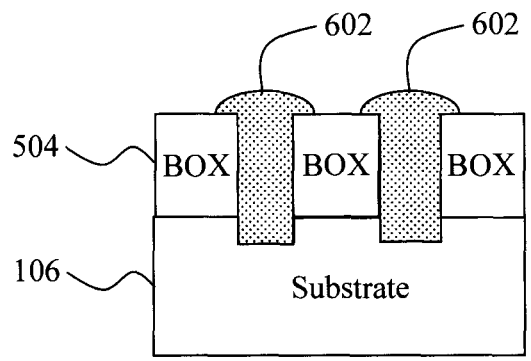
FIG. 6 is a cross-sectional diagram illustrating an epitaxial material having been grown in the trenches, overfilling the trenches, according to an embodiment of the present invention.
Figure 7:
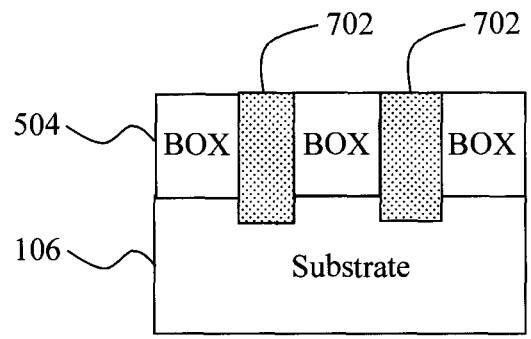
FIG. 7 is a cross-sectional diagram illustrating the epitaxial material having been polished to planarity thus forming fins in the trenches according to an embodiment of the present invention.

As shown in FIG. 5, the patterned (and smoothed) SOI layer 302 is used to pattern trenches 502 in the BOX 108, wherein the line pattern from the SOI layer 302 is transferred to the BOX 108. The BOX post-patterning is given the reference numeral 504. As will be described in detail below, epitaxy will be used to grow fins in the trenches up from the substrate 106. Thus, it is desirable that the trenches extend through the BOX and down to the substrate, and exposing the substrate. The trenches 502 may be formed using a RIE process. Depending on the selectivity of the etch, the trenches 502 can also extend partway through the substrate 106.

Following the trench etch, any remaining patterned SOI layer 302 can be removed using, for example, a RIE or mechanical etching process such as chemical mechanical polishing (CMP). See FIG. 6. It is notable that when using RIE, the trenches 502 should be filled with a sacrificial material (not shown) to prevent etching within the trenches, and which sacrificial material can be selectively removed following the RIE etch.

Next, an epitaxial material 602 is grown in the trenches 502. This epitaxial material 602 will form fins in the trenches. The epitaxial material 602 is grown up from the trench bottoms (i.e., up from the substrate 106) using a process such as Rapid Thermal Chemical Vapor Deposition (RTCVD). The growth is continued until the epitaxial material 602 has filled (and overfilled) the trenches 502. See FIG. 6. The epitaxial material 602 may then be polished to planarity using, for example, CMP and thus forming fins 702 in the trenches 502. See FIG. 7. Following the fin formation, the patterned BOX 504 can be removed to release the fins, or left in place, depending on the particular device application.

The epitaxial material 602 employed may be any epitaxial semiconductor material from which fins 702 may be formed for a given device application. Suitable semiconductor materials include, but are not limited to, epitaxial silicon, silicon germanium, germanium, and III-V semiconductor materials. According to an exemplary embodiment, the epitaxial material 602 (and subsequent fins 702) is/are formed from a III-V semiconductor material. The term III-V semiconductor material (or simply III-V material), as used herein and throughout the following description, refers to a material that includes at least one group III element and at least one group V element. By way of example only, suitable III-V materials include, but are not limited to, one or more of aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium arsenide phosphide, indium gallium nitride, indium nitride, indium phosphide and combinations including at least one of the foregoing materials.

As described above, during the BOX etch there is likely some over etch into the underlying substrate. While some over etch is expected and is acceptable, when it occurs there is some concern that growth of the epitaxial material will occur from the sidewalls of the substrate in the trench. This is undesirable because the epitaxial growth from several fronts (bottom floor and left and right sidewalls) will lead to defects when these fronts collide. Namely, it is desirable to have epitaxial growth from the substrate at the bottom of the trenches, but not from the sidewalls. Ideally, the trench etch would be endpointed at the exact interface between the BOX and the substrate. Thus no substrate sidewalls would be present. However, in practice overetching into the substrate occurs and the substrate is present along (a portion of) the sidewalls of the trenches. The following steps may be taken, however, to limit epitaxial growth of the fins to that coming up from the trench bottoms (and not from the sides).

Figure 8:
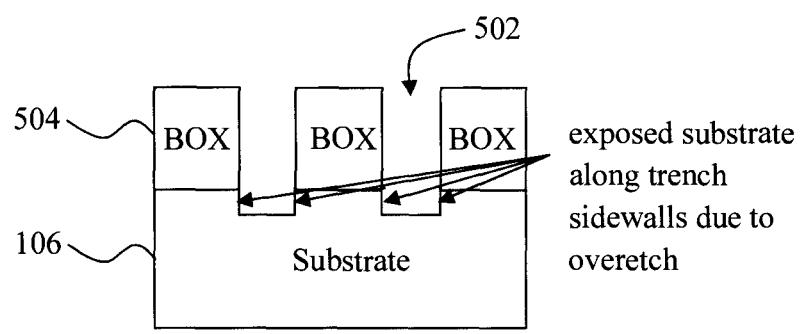
FIG. 8 is a cross-sectional diagram following from FIG. 5 illustrating how overetch of the trenches may expose the substrate along a portion of the trench sidewalls according to an embodiment of the present invention.

In the description that follows, the process will be described from the point at which this exemplary embodiment deviates from the above-described process. Namely, the techniques involved in patterning an SOI layer mask, smoothening the patterned SOI layer mask, and using the (near-perfect) patterned SOI layer as a mask to pattern the BOX are the same as that described in conjunction with the description of FIGS. 1-5, above. Accordingly, like numerals are being used to indicate the same structures in the figures. Beginning, for example, with the patterned structure from FIG. 5, as shown in FIG. 8 after the trenches 502 have been etched, any remaining patterned SOI layer 302 can be removed. The trenches 502 are overetched partway into the substrate 106. The result is that the substrate 106 is exposed along (a portion of) the sidewalls of the trenches 502. See FIG. 8.

Figure 9:
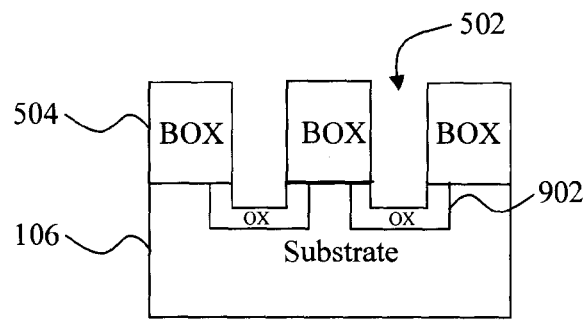
FIG. 9 is a cross-sectional diagram illustrating the exposed substrate in the trenches having been oxidized forming an oxide in the substrate at the bottom and portions of the sidewalls of the trenches according to an embodiment of the present invention.
Figure 10:
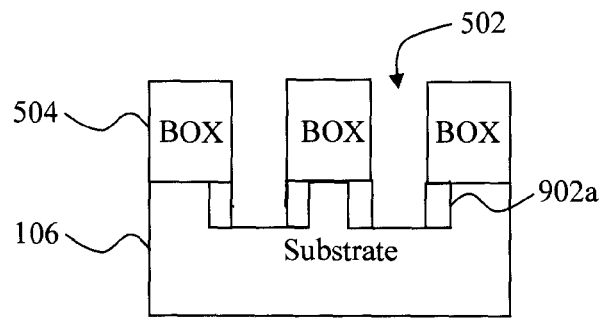
FIG. 10 is a cross-sectional diagram illustrating an etch having been used to break through the oxide at the bottom of each of the trenches leaving portions of the oxide passivating the sidewalls according to an embodiment of the present invention.

In order to prevent epitaxial growth from these exposed sidewalls (i.e., and thereby limit epitaxial growth to the trench bottoms), an oxidation process is then used to form spacers in the trenches that will passivate the sidewalls. Namely, as shown in FIG. 9, the trenches in the substrate are first oxidized, forming an oxide 902 along the bottom and sidewalls of the substrate within each of the trenches 502. According to an exemplary embodiment, the substrate is oxidized using a thermal oxidation process. The oxide produced in this manner is often referred to as a thermal oxide.

Next, a directional, anisotropic etch, such as RIE, is then used to remove (i.e., break through) the oxide 902 at the bottom of each of the trenches 502. See FIG. 10. Specifically, a RIE etch will extend the bottom of the trench further into the substrate past the oxide 902 at the bottom of the trenches (i.e., and removing the oxide 902 at the bottom of the trenches). What will remain of the oxide 902 are the portions (i.e., oxide spacers) along the sidewalls of the trench in the substrate. These remaining portions of the oxide along the sidewalls are now given the reference numeral 902a and are the spacers. These oxide portions 902a will passivate the substrate along the sidewalls of the trenches 502, such that subsequent epitaxial growth will occur only up from the bottom of the trenches 502.

Even though it is hard to stop the etch at the interface between the oxide 902 and the underlying substrate 106, and some over-etching may occur, the etch (e.g., RIE) used to break through the bottom oxide will not actually create new exposed sidewalls in the trenches 502 because the oxide 902 is substantially thinner (about 2 nm) than the BOX thickness (about 100 nm). As a result, an over etch (for example of 10%) will result in a smaller exposed sidewalls of 0.2 nm for etching the oxide 902 versus 10 nm for etching the BOX.

Figure 11:
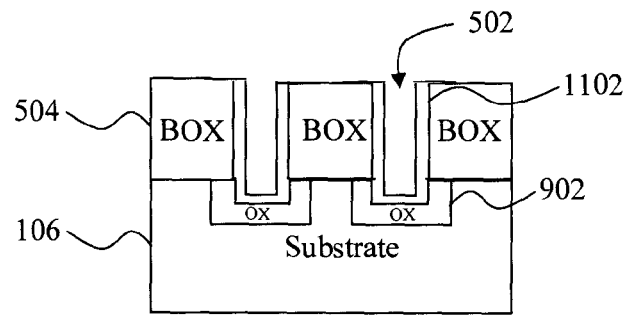
FIG. 11 is a cross-sectional diagram illustrating an alternative embodiment that may be used to passivate the trench sidewalls in the substrate, following formation of the oxide in the trenches as shown in FIG. 9, a conformal silicon nitride ($Si_3N_4$) layer is deposited in the trench according to an embodiment of the present invention.
Figure 12:
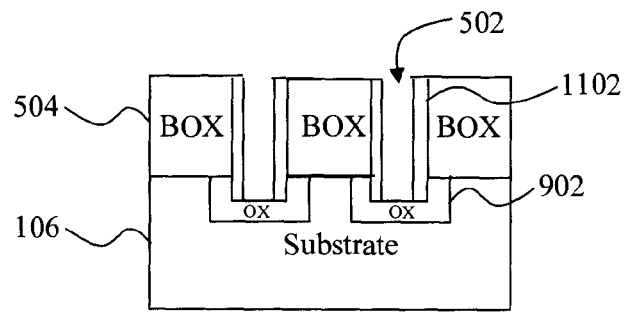
FIG. 12, which follows from FIG. 11, is a cross-sectional diagram illustrating a directional RIE process selective for etching the $Si_3N_4$ layer having been used to remove the bottom portion of the $Si_3N_4$ layer, exposing the oxide layer at the bottom of the trenches according to an embodiment of the present invention.
Figure 13:
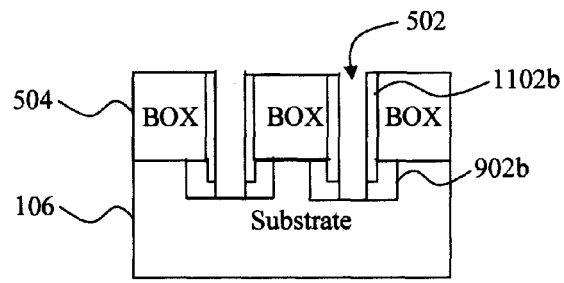
FIG. 13, which follows from FIG. 12, is a cross-sectional diagram illustrating a diluted HF etch having been used to remove the portions of oxide layer exposed at the bottom of the trenches according to an embodiment of the present invention.

Notwithstanding, additional measures may be taken to prevent creating new sidewalls within the trenches through the use of a combination oxide/nitride spacer in the trenches. For instance, according to an alternative embodiment which is now described by way of reference to FIGS. 11-13, following the growth of oxide layer 902 as described above a conformal silicon nitride ($Si_3N_4$) layer 1102 is deposited into each of the trenches 502. See FIG. 11. As shown in FIG. 11, the $Si_3N_4$ layer 1102 coats the sidewalls and bottom of each of the trenches 502. A directional RIE process that etches the $Si_3N_4$ layer 1102 selective to the oxide 902 is then used to remove the bottom portion of the $Si_3N_4$ layer 1102, exposing the oxide layer 902 at the bottom of the trenches 502. See FIG. 12. A diluted HF etch can then be used to remove the portions of oxide layer 902 exposed at the bottom of the trenches 502. See FIG. 13. Due to the very high oxide-selectivity of HF to Si, SiGe, Ge, etc., in this alternative process no etching occurs into the substrate 106. Additionally, no damage due to RIE will be present at the substrate surface. As described above, what will remain of the oxide 902/$Si_3N_4$ layer 1102 are the portions along the sidewalls of the trench in the substrate. These remaining portions (i.e., oxide/nitride spacers) of the oxide along the sidewalls are in this embodiment now given the reference numeral 902b/1102b and are the spacers. These oxide/nitride portions 902b/1102b will passivate the substrate along the sidewalls of the trenches 502, such that subsequent epitaxial growth will occur only up from the bottom of the trenches 502.

Figure 14A:
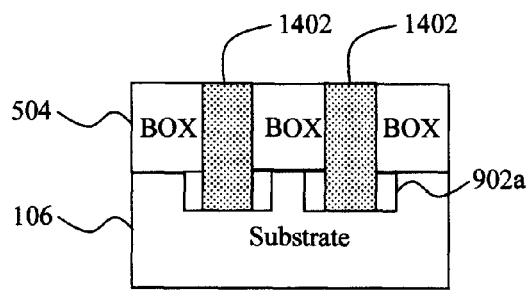
FIG. 14A, which follows from FIG. 10, is a cross-sectional diagram illustrating an epitaxial material having been grown in the trenches according to an embodiment of the present invention.
Figure 14B:
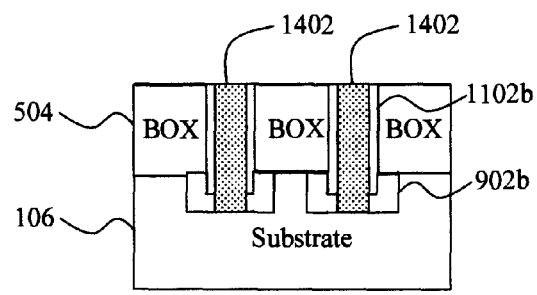
FIG. 14B, which follows from FIG. 13, is a cross-sectional diagram illustrating an epitaxial material having been grown in the trenches according to an embodiment of the present invention.

The process may then proceed as described above to grow an epitaxial material 1402 in the trenches. Any of the above-described materials (e.g., III-V semiconductor materials) may be employed. While the details of the process are provided above, it is notable that the epitaxial material is preferably formed so as to overfill the trenches, and then polished back, e.g., using CMP. The final result is shown in FIGS. 14A and 14B. FIG. 14A represents the structure after the oxide layer alone (depicted in FIGS. 9 and 10) is used to passivate the trench sidewalls in the substrate and FIG. 14B represents the structure after the oxide layer in combination with a silicon nitride layer (alternative embodiment described above and depicted in FIGS. 11-14) are used to passivate the trench sidewalls in the substrate.

With the present process, the anneal is performed to smoothen the sidewalls of the patterned SOI layer mask (see above) not the substrate. Thus, as highlighted above, in addition to silicon, the substrate can be also be formed from a variety of materials including those that do not respond to (i.e., would not be affected or benefit from) a smoothening anneal, such as gallium arsenide (GaAs). According to an exemplary embodiment, the substrate 106 is formed from a bulk germanium wafer or a germanium-on-insulator (GOI) wafer. With regard to these other substrate materials, it is important to keep in mind that the patterned SOI layer is needed for the smoothening anneal.

Figure 15:
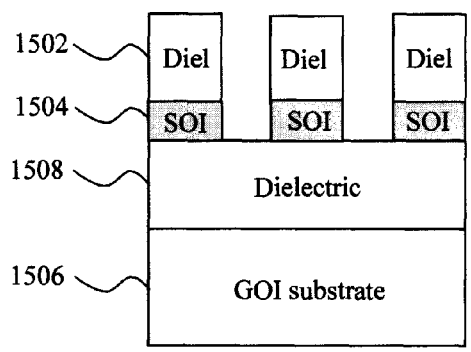
FIG. 15 is a cross-sectional diagram illustrating an alternative embodiment employing a germanium substrate wherein a dielectric layer is present on the germanium substrate, and a patterned SOI layer and hardmask are present on the dielectric layer according to an embodiment of the present invention.

Thus, using a non-limiting example of a GOI substrate to illustrate this point, as is shown in FIG. 15, a dielectric layer 1508 is first formed (i.e., deposited) on the GOI substrate 1506, a SOI layer 1504 is formed on the dielectric layer 1508, and a hardmask or resist (e.g., patterned dielectric 1502) is formed on the SOI layer. Suitable dielectric materials for dielectric layer 1508 include, but are not limited to, an oxide material such as silicon oxide. The dielectric layer 1508 serves the same function as BOX 108 above (and can be formed from the same material(s)), however to distinguish this configuration from a standard SOI wafer configuration, the layer 1508 is simply referred to herein as a dielectric. The goal here, as above, is to use the substrate as the template for growth of an epitaxial material in trenches formed in the dielectric layer. Namely, growth of the epitaxial material will be template from the substrate. In the case of a GOI wafer, as is known in the art, growth will be template from a GOI layer which is separated from an underlying substrate by a BOX. While these layers are not explicitly shown in FIG. 15, this configuration of a GOI wafer is well known to those of skill in the art.

The process may then proceed in the same manner as described in detail above. Namely, the patterned dielectric 1502 is used to pattern ART lines in the SOI layer (the post patterning SOI layer is given reference numeral 1504). The above-described annealing process is then employed to smoothen the sidewalls of the lines patterned in the SOI layer 1504. The anneal serves to form a near-perfect mask from the patterned SOI layer. Following the smoothening anneal, the patterned dielectric 1502 (if still present) is removed.

Figure 16:
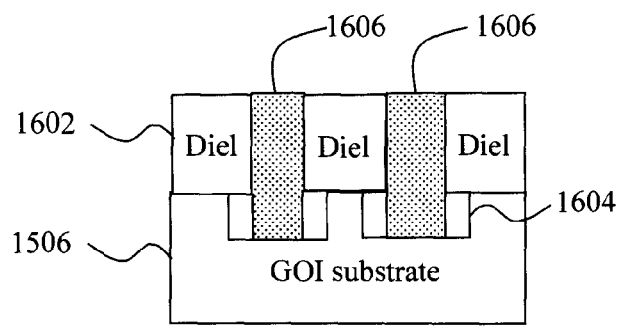
FIG. 16 is a cross-sectional diagram illustrating the patterned SOI layer, post smoothening anneal, having been used to pattern trenches in the dielectric layer, oxide having been formed passivating the sidewalls of the trenches in the germanium substrate resulting from overetch of the trenches, and epitaxially-grown fins having been formed in the trenches according to an embodiment of the present invention.

Next, as shown in FIG. 16, the patterned SOI layer is used as a mask to pattern trenches in the dielectric 1508 (which post-patterning is given reference numeral 1602). As shown in FIG. 16, the process described in conjunction with the description of FIGS. 8-13 can be performed to compensate for any trench overetch into the substrate by forming an oxide 1604 to passivate the substrate in the sidewalls of the trenches (thereby limiting epitaxial growth to that up from the bottom of the trenches). Epitaxial material is grown overfilling the trenches and then polished back, e.g., using CMP, to form fins 1606. According to an exemplary embodiment, the epitaxial material is a III-V semiconductor material.

Figure 17:
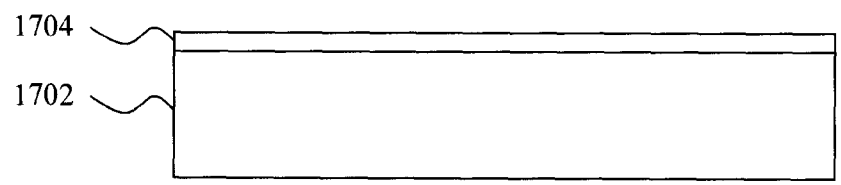
FIG. 17 is a cross-sectional diagram illustrating the starting structure for yet another alternative embodiment including a silicon substrate and a hardmask layer over the silicon substrate according to an embodiment of the present invention.
Figure 18:
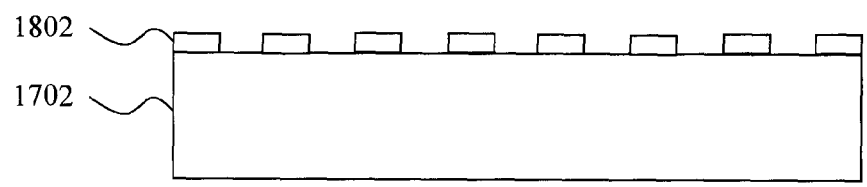
FIG. 18 is a cross-sectional diagram illustrating the hardmask layer having been patterned with the footprint and location of one or more ART trenches according to an embodiment of the present invention.
Figure 19:
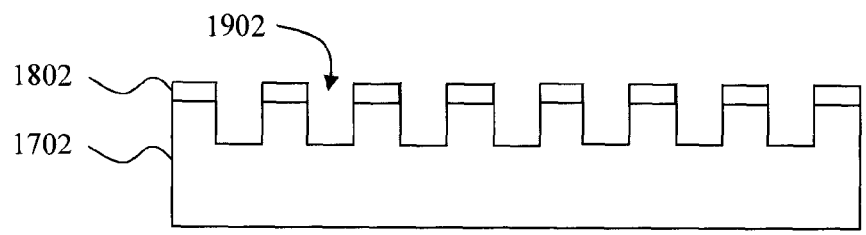
FIG. 19 is a cross-sectional diagram illustrating the patterned hardmask having been used to pattern the trenches in the silicon substrate according to an embodiment of the present invention.
Figure 20:
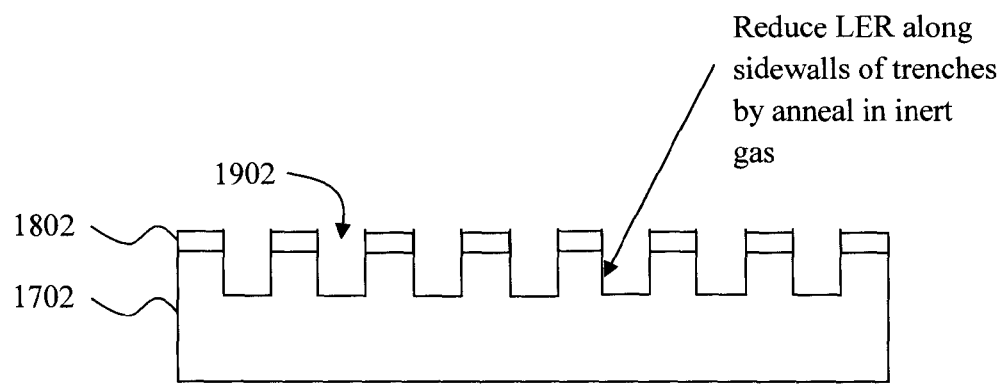
FIG. 20 is a cross-sectional diagram illustrating an anneal having been performed to smoothen the sidewalls of the trenches according to an embodiment of the present invention.

The present techniques can be further leveraged to form a series of III-V material and silicon fins in a silicon substrate. This exemplary embodiment is now described by way of reference to FIGS. 17-24. It is notable that in this scenario the smoothening anneal will be performed after trenches have been patterned in the substrate. Accordingly, the substrate in this case should be formed from a material that benefits from a smoothening anneal, in this particular example silicon. Thus, as shown in FIG. 17, a silicon substrate 1702 is provided. A hardmask 1704 is formed on the silicon substrate 1702. The hardmask 1704 is then patterned with the footprint and location of one or more ART trenches to be patterned in the substrate 1702. See FIG. 18. Post-patterning, the hardmask is given reference numeral 1802.

The patterned hardmask 1802 is then used to pattern one or more trenches 1902 in the substrate 1702. See FIG. 19. According to an exemplary embodiment, the trenches are patterned using a RIE process. As described above, a certain amount of LER will be present on the trench sidewalls. If one were then to next grow III-V fins in the trenches, that LER would be replicated in the fins, which is undesirable. Thus, prior to forming the fins in the trenches, an anneal is performed according to the above-described parameters to smoothen the sidewalls of the trenches 1902, thus reducing the LER in the trenches. See FIG. 20.

Figure 21:
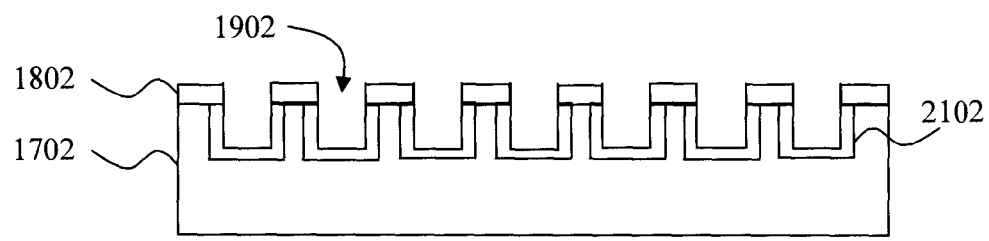
FIG. 21 is a cross-sectional diagram illustrating an oxide having been formed lining the bottom and sidewalls of each of the trenches according to an embodiment of the present invention.
Figure 22:
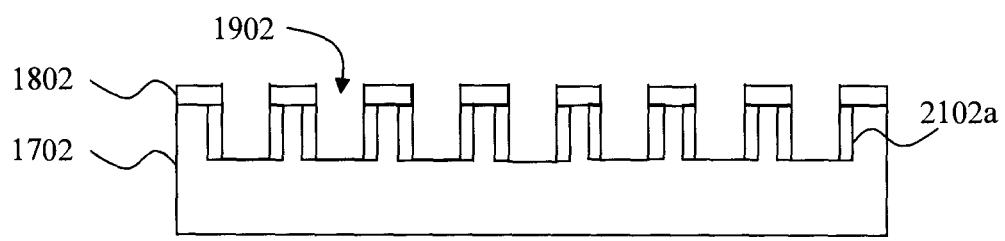
FIG. 22 is a cross-sectional diagram illustrating an etch having been used to remove the oxide at the bottom of the trenches according to an embodiment of the present invention.

Further, as described above, it is desirable to be able to limit the epitaxial growth to that up from the bottom of the trenches (and not from the sidewalls). This may be accomplished using the above-described processes for forming an oxide layer alone (depicted in FIGS. 9 and 10) or in combination with a silicon nitride layer (alternative embodiment described above and depicted in FIGS. 11-14) to passivate the trench sidewalls in the substrate in conjunction with one or more selective etching steps as described in detail above. Namely, as shown in FIG. 21, the trenches are first oxidized, forming an oxide 2102 along the bottom and sidewalls of the trenches 1902. Processes for forming the oxide in the trenches are described in detail above. Next, as described above an anisotropic etch, such as RIE, is then used to remove (i.e., break through) the oxide 2102 at the bottom of each of the trenches 1902. What remains is portions 2102a of the oxide lining the sidewalls of the trenches. As noted above, the RIE etch to remove the oxide at the bottom of the trenches will extend the trenches further into the substrate 1702 past the oxide 2102 at the bottom of the trenches (the amount of etching however is small if the oxide 1802 is thin as discussed above). See FIG. 22. Further, as provided above, a silicon nitride ($Si_3N_4$) may be used in conjunction with the oxide layer to prevent overetch into the substrate. In either case, the resulting oxide 2102a will passivate the sidewalls of the trenches and limit growth of the epitaxial material (to be formed in the trenches) to that up from the bottom (exposed) portions of the trenches.

Figure 23:
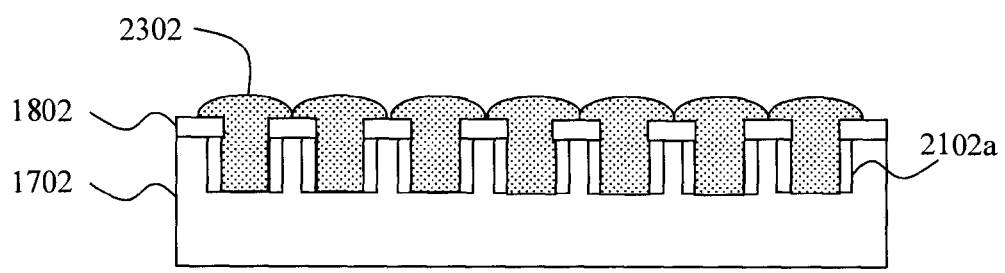
FIG. 23 is a cross-sectional diagram illustrating an epitaxial (e.g., III-V) material having been grown up from the bottom of the trenches, overfilling the trenches, according to an embodiment of the present invention.
Figure 24:
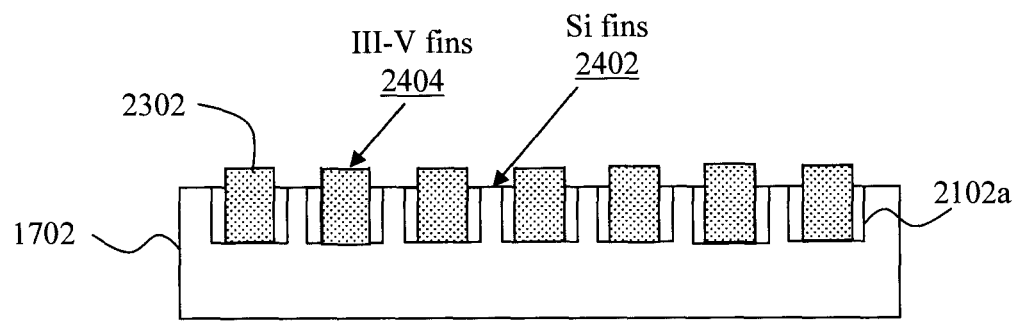
FIG. 24 is a cross-sectional diagram illustrating the epitaxial material having been polished to planarity and the patterned hardmask having been removed, resulting in one or more silicon fins and one or more epitaxial (e.g., III-V) fins having been formed on the wafer according to an embodiment of the present invention.

As shown in FIG. 23, an epitaxial material 2302 is grown in the trenches 1902. This epitaxial material 2302 will form fins in the trenches. As described above, the epitaxial material 2302 can be grown up from the trench bottoms using a process such as RTCVD. It is preferable that the growth is continued until the epitaxial material 2302 has filled (and overfilled) the trenches 1902. See FIG. 23. The epitaxial material 2302 may then be polished to planarity using, for example, CMP and thus forming fins 2402 in the trenches 1902. See FIG. 24. The patterned hardmask 1802 serves as a polish stop layer during the CMP, but is then subsequently removed using, for example, a wet etching process. The result, as shown in FIG. 24, is a plurality of silicon fins 2402 and a plurality of, e.g., III-V, fins 2404 from which one or more devices can be built. In the exemplary embodiment shown in FIG. 24, the silicon and III-V fins alternate, and each of the fins is separated from its adjacent fins by the sidewall portion 2102a of the oxide, thus effectively isolating each of the fins.

The present techniques are further illustrated by way of reference to the following non-limiting examples. FIG. 25A is a top-down image of a patterned SOI layer over a silicon substrate (prior to a smoothening anneal). As shown in FIG. 25A, there is significant amount of line edge roughness (LER) in the as-patterned SOI layer. However, using the present techniques (in this example, a smoothening anneal in hydrogen gas (H2) at 925° C. for 10 minutes), the LER in the patterned SOI is reduced (from 8.21 nm to 2.18 nm in this case). See FIG. 25B. As shown in FIG. 25B, the sidewalls of the patterned SOI are visibly smoother following the present smoothening/annealing process. Line edge roughness represents a deviation of the edge of a feature from an ideal (i.e., smooth) shape. See, for example, the tutorial "Measuring Line Edge Roughness: Fluctuations in Uncertainty," The Lithography Expert (version May 26, 2008), the contents of which are incorporated by reference as if fully set forth herein, which details exemplary techniques for measuring line edge roughness.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of aspect ratio trapping (ART) with reduced line-edge-roughness (LER), the method comprising the steps of:
   providing a silicon layer separated from a substrate by a dielectric layer;
   patterning one or more ART lines in the silicon layer selective to the dielectric layer;
   contacting the silicon layer with an inert gas at a temperature, pressure and for a duration sufficient to cause re-distribution of silicon along sidewalls of the ART lines patterned in the silicon layer, thereby reducing an LER of the ART lines in the silicon layer as compared to a LER of the ART lines as patterned in the silicon layer, resulting in formation of a smoothened, patterned silicon layer;
   using the smoothened, patterned silicon layer to pattern one or more ART trenches in the dielectric layer, wherein the substrate is exposed at a bottom of each of the trenches; and
   epitaxially growing a semiconductor material in the trenches, up from the substrate at the bottom of each of the ART trenches, to form fins in the ART trenches.

2. The method of claim 1, further comprising the steps of:
   forming a patterned mask on the silicon layer; and
   using the patterned mask to pattern the silicon layer.

3. The method of claim 2, further comprising the step of:
   removing the patterned mask after the contacting step has been performed.

4. The method of claim 1, wherein the semiconductor material is grown in the trenches so as to overfill the trenches, the method further comprising the step of:
   polishing the epitaxial material to planarity to form the fins in the ART trenches.

5. The method of claim 1, wherein the inert gas is selected from the group consisting of: hydrogen ($H_2$), xenon (Xe), and helium (He).

6. The method of claim 1, wherein the pressure is from about 30 torr to about 1000 torr.

7. The method of claim 1, wherein the temperature is from about 600 degrees Celsius (° C.) to about 1100° C.

8. The method of claim 1, wherein the duration is from about one minute to about 120 minutes.

9. The method of claim 1, wherein the semiconductor material epitaxially grown in the trenches is selected from the group consisting of: epitaxial silicon, epitaxial silicon germanium, epitaxial germanium, and epitaxial III-V semiconductor materials.

10. The method of claim 9, wherein the semiconductor material epitaxially grown in the trenches comprises an epitaxial III-V semiconductor material selected from the group consisting of: aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium arsenide phosphide, indium gallium nitride, indium nitride, indium phosphide and combinations comprising at least one of the foregoing materials.

11. The method of claim 1, wherein the ART trenches extend part way through the substrate, such that a portion of the substrate is present along sidewalls of each of the ART trenches, the method further comprising the steps of:
   forming an oxide along the bottom and the portion of the substrate present along the sidewalls of each of the ART trenches; and
   removing a first portion of the oxide at the bottom of each of the ART trenches such that one or more second portions of the oxide remain along the portion of the substrate present along the sidewalls of each of the ART trenches.

12. The method of claim 9, wherein the first portion of the oxide at the bottom of each of the ART trenches is removed using an anisotropic etching process.

13. The method of claim 1, wherein the substrate comprises a silicon or germanium substrate.

14. A method of ART with reduced LER, the method comprising the steps of:
   patterning one or more ART trenches in a silicon substrate using a patterned hardmask;
   contacting the substrate with an inert gas at a temperature, pressure and for a duration sufficient to cause re-distribution of silicon along sidewalls of the ART trenches patterned in the substrate, thereby reducing an LER of the ART trenches as compared to a LER of the ART trenches as patterned in the substrate;
   forming spacers along the sidewalls of each of the ART trenches; and
   epitaxially growing a semiconductor material in the ART trenches, up from the substrate at the bottom of each of the ART trenches, to form fins in the ART trenches.

15. The method of claim 14, wherein the step of forming the spacers along the sidewalls of each of the ART trenches further comprises the steps of:
   forming an oxide along a bottom and the sidewalls of each of the ART trenches; and removing a first portion of the oxide at the bottom of each of the ART trenches such that one or more second portions of the oxide remain along the sidewalls of each of the ART trenches, wherein the one or more second portions of the oxide form the spacers along the sidewalls of each of the ART trenches.

16. The method of claim 14, wherein the step of forming the spacers along the sidewalls of each of the ART trenches further comprises the steps of:

forming an oxide along a bottom and the sidewalls of each of the ART trenches;

depositing a conformal $Si_3N_4$ film over the oxide along the bottom and the sidewalls of each of the ART trenches;

removing a first portion of the conformal $Si_3N_4$ film at the bottom of each of the ART trenches such that one or more second portions of the conformal $Si_3N_4$ film remain along the sidewalls of each of the ART trenches; and removing a first portion of the oxide at the bottom of each of the ART trenches such that one or more second portions of the oxide remain along the sidewalls of each of the ART trenches, wherein the one or more second portions of the conformal $Si_3N_4$ film and the one or more second portions of the oxide form the spacers along the sidewalls of each of the ART trenches.

17. The method of claim 14, wherein the semiconductor material is grown in the trenches so as to overfill the trenches, the method further comprising the step of:

polishing the epitaxial material to planarity to form the fins in the ART trenches.

18. The method of claim 14, wherein the inert gas is selected from the group consisting of: hydrogen ($H_2$), xenon (Xe), and helium (He).

19. The method of claim 14, wherein the pressure is from about 30 torr to about 1000 torr.

20. The method of claim 14, wherein the temperature is from about 600° C. to about 1100° C.

21. The method of claim 14, wherein the duration is from about one minute to about 120 minutes.

22. The method of claim 14, wherein the semiconductor material epitaxially grown in the trenches is selected from the group consisting of: epitaxial silicon, epitaxial silicon germanium, epitaxial germanium, and epitaxial III-V semiconductor materials.

23. The method of claim 20, wherein the semiconductor material epitaxially grown in the trenches comprises an epitaxial III-V semiconductor material selected from the group consisting of: aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium arsenide phosphide, indium gallium nitride, indium nitride, indium phosphide and combinations comprising at least one of the foregoing materials.

* * * * *